United States Patent
Wu et al.

(10) Patent No.: US 9,230,622 B2
(45) Date of Patent: Jan. 5, 2016

(54) SIMULTANEOUS TWO/DUAL PORT ACCESS ON 6T SRAM

(71) Applicant: Taiwan Semiconductor Manufacturing Company, Ltd., Hsin-Chu (TW)

(72) Inventors: Ching-Wei Wu, Caotun Town (TW); Chia-Cheng Chen, Taichung (TW); Kuang Ting Chen, Taipei (TW); Wei-Shuo Kao, Taichuang (TW); Jui-Che Tsai, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 203 days.

(21) Appl. No.: 13/691,256

(22) Filed: Nov. 30, 2012

(65) Prior Publication Data

US 2014/0153349 A1    Jun. 5, 2014

(51) Int. Cl.
| | |
|---|---|
| *G11C 7/00* | (2006.01) |
| *G11C 8/18* | (2006.01) |
| *G11C 7/10* | (2006.01) |
| *G11C 7/22* | (2006.01) |
| *G11C 8/16* | (2006.01) |

(52) U.S. Cl.
CPC ............... *G11C 8/18* (2013.01); *G11C 7/1039* (2013.01); *G11C 7/1066* (2013.01); *G11C 7/1093* (2013.01); *G11C 7/222* (2013.01); *G11C 8/16* (2013.01)

(58) Field of Classification Search
USPC .......................................... 365/203
See application file for complete search history.

(56) References Cited

U.S. PATENT DOCUMENTS

| | | | |
|---|---|---|---|
| 7,251,186 B1 * | 7/2007 | Kengeri et al. | 365/230.05 |
| 7,561,475 B2 | 7/2009 | Kim et al. | |
| 7,616,519 B2 | 11/2009 | Komatsu et al. | |
| 2005/0128827 A1 | 6/2005 | Shionoiri et al. | |
| 2013/0111253 A1 * | 5/2013 | Lewis | 713/400 |

* cited by examiner

*Primary Examiner* — Hoai V Ho
*Assistant Examiner* — Pablo Huerta
(74) *Attorney, Agent, or Firm* — Slater & Matsil, L.L.P.

(57) ABSTRACT

A method includes generating a first and a second internal clock signal from a clock signal, wherein a first internal clock signal edge of the first internal clock signal and a second internal clock signal edge of the second internal clock signal are generated from a same edge of the clock signal. A first one of the first and the second internal clock edges is used to trigger a first operation on a six-transistor (6T) Static Random Access Memory (SRAM) cell of a SRAM array. A second one of the first and the second internal clock edges is used to trigger a second operation on the 6T SRAM cell. The first and the second operations are performed on different ports of the 6T SRAM. The first and the second operations are performed within a same clock cycle of the clock signal.

25 Claims, 7 Drawing Sheets

SIMULTANEOUS TWO/DUAL PORT ACCESS ON 6T SRAM

BACKGROUND

Static Random Access Memory (SRAM) is widely used in integrated circuits. SRAM cells stores data in latches that are formed of two P-type Metal-Oxide-Semiconductor (PMOS) devices and two N-type Metal-Oxide-Semiconductor (NMOS) devices. SRAMs have many designs including, for example, Six-Transistor (6T) SRAMs, Eight-Transistor (8T) SRAMs, single-port SRAMs, two-port SRAMs, dual-port SRAMs, and the like. An SRAM may be referred to as a two/dual port SRAM, indicating that the SRAM may be a two-port SRAM or a dual-port SRAM.

Conventionally, 8T SRAMs with two/dual ports are operated with two clock signals, one for read/write operations, and one for write/read operations. The two clock signals are independent from each other. Although the performance of the two/dual portion 8T SRAMs is high due to the fact the that the two clock signals may be tuned independently from each other, the chip area occupied by the two/dual port 8T SRAMs is high. Accordingly, pseudo two-/dual-port 6T SRAMs were designed.

The sizes of the 6T SRAMs are smaller compared to two/dual port 8T SRAMs. For example, the chip area occupied by 8T SRAMs may be 1.5 times the chip area occupied by 6T SRAMs. Due to structure limitations, the 6T SRAMs use one clock signal for both read operations and write operations, wherein the rising edges of the clock signal are used for read operations, and the falling edges of the clock signal are used for write operations, or vice versa.

The performance of the pseudo two/dual port 6T SRAMs, however, is limited. This is because the read operations and the write operations are tied together, and the clock cycle time has to be long enough to accommodate the one of the read and write operations that takes longer time to finish. Hence, it is difficult to tune the performance of pseudo two-/dual port 6T SRAMs.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A clock generation scheme for reading and writing Static Random Access Memory (SRAM) cells and the exemplary clock generation circuits are provided in accordance with various exemplary embodiments. The variations and the operation of the embodiments are discussed. Throughout the various views and illustrative embodiments, like reference numbers are used to designate like elements. Throughout the description, for example, in FIGS. 4 and 6, the rising edges of some clock signals are used as examples for triggering actions such as the generation internal clock signal edges. In alternative embodiments, the falling edges may also be used to trigger actions. It is appreciated that the concepts "row" and "column" may be interchangeable, and the concepts "row address" and "column address" may be interchangeable, an address may thus be referred to as a "row/column" address, indicating it may be a row address or a column address.

Figure 1:
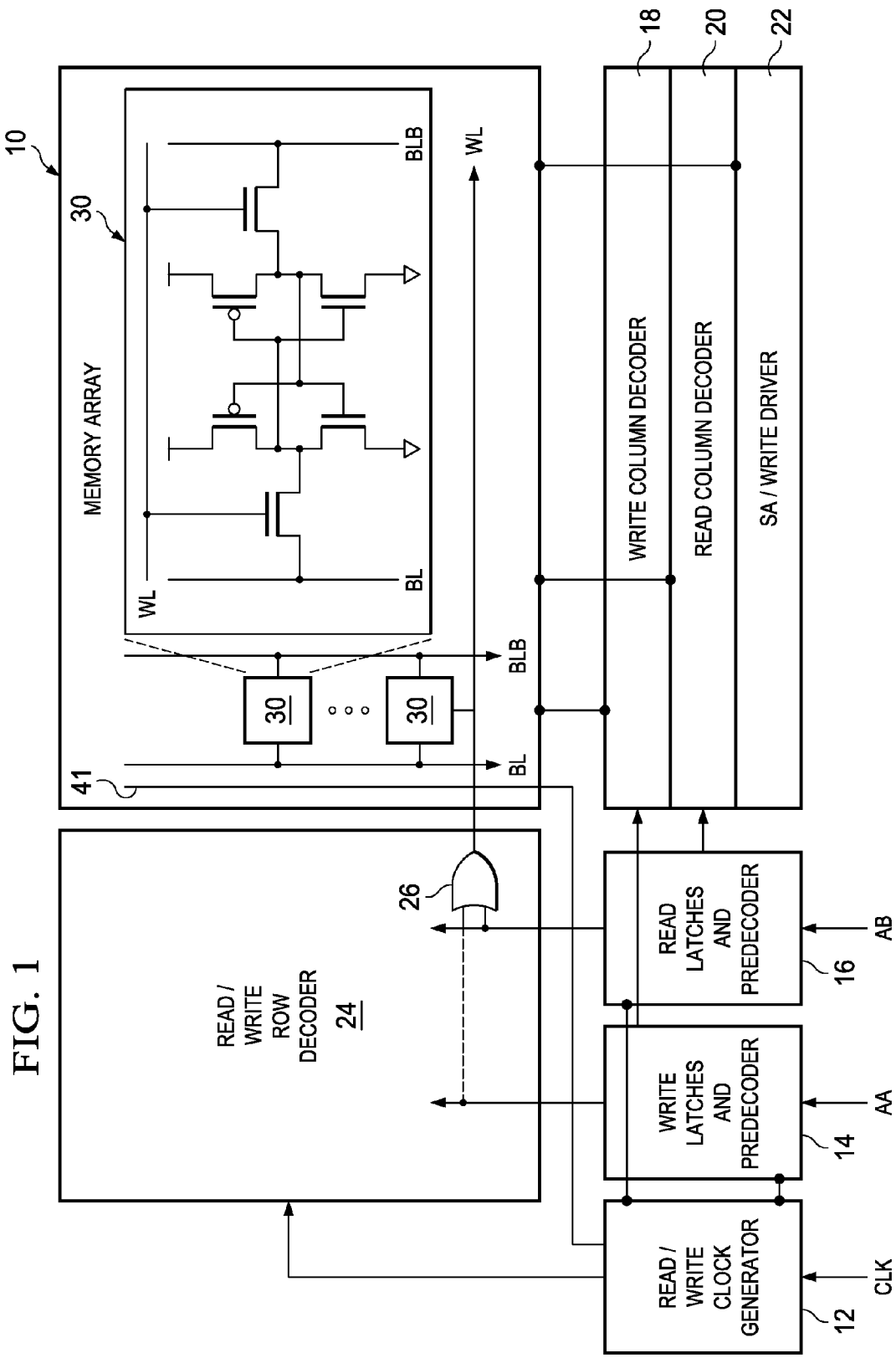
FIG. 1 illustrates an exemplary block diagram of a Static Random Access Memory (SRAM) array, and the circuits for performing read and write operations on the SRAM array.
Figure 4:
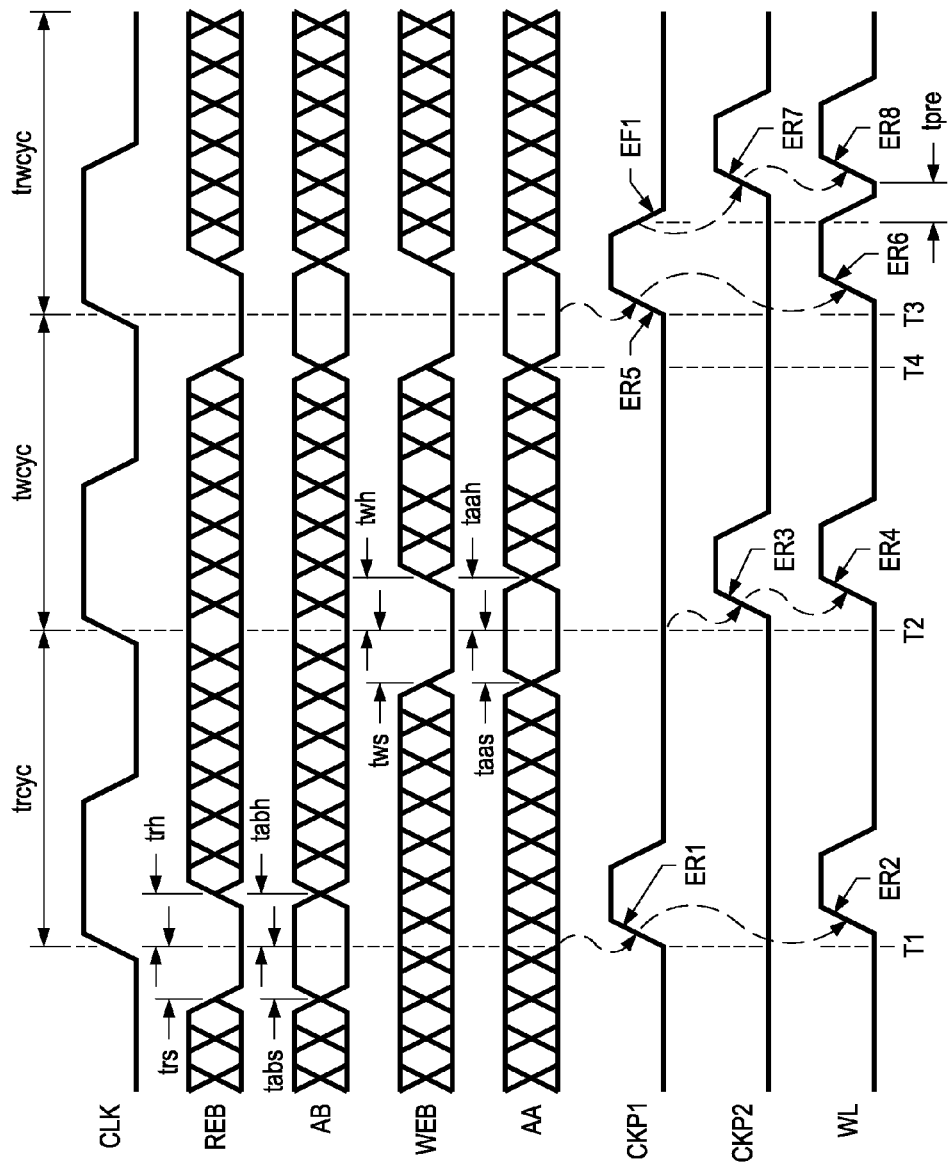
FIG. 4 illustrates an exemplary sequence diagram of the exemplary read/write clock generator in FIG. 3.
Figure 6:
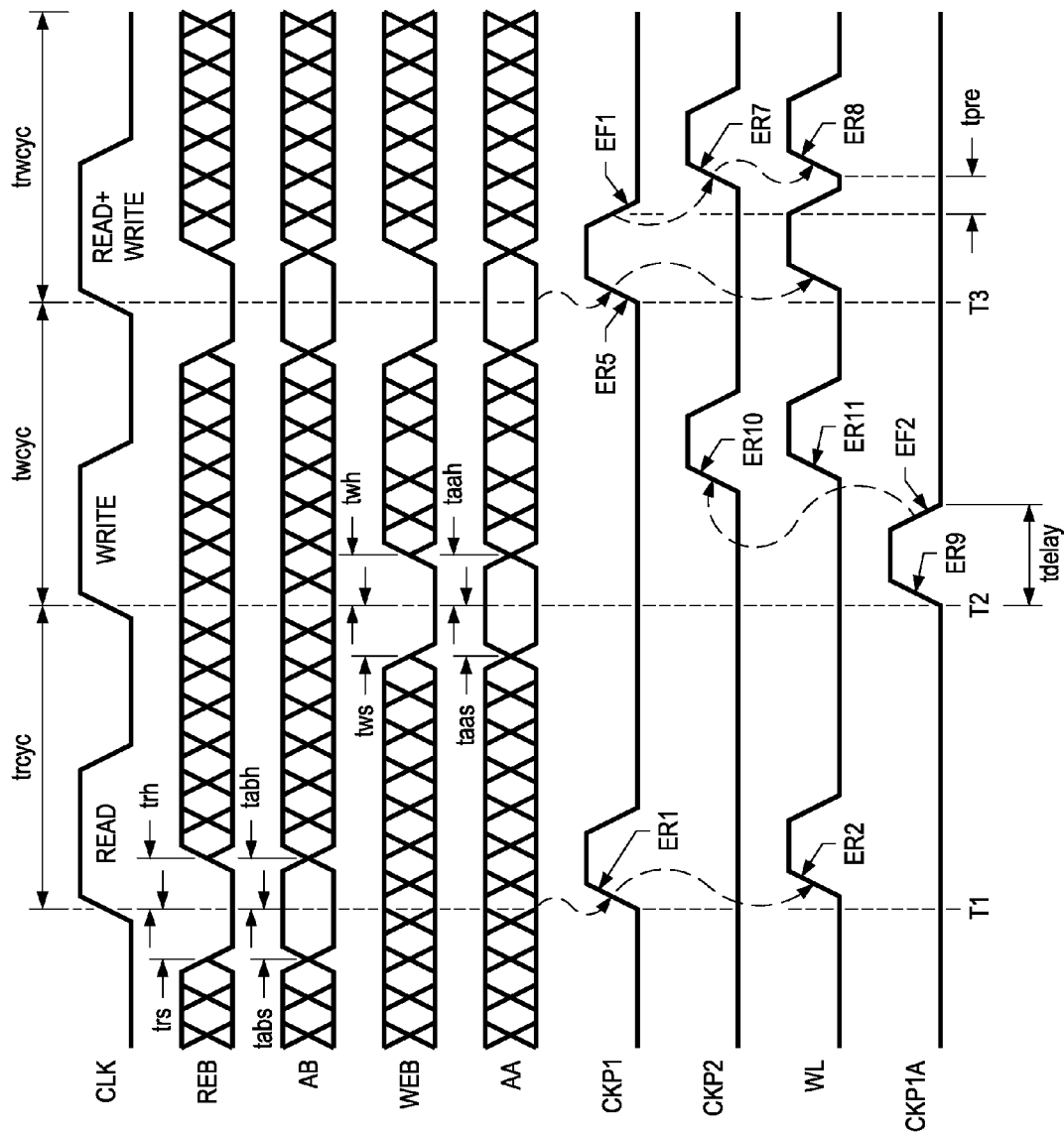
FIG. 6 illustrates an exemplary sequence diagram of the exemplary read/write clock generator in FIG. 5.

FIG. 1 illustrates an exemplary block diagram of SRAM array 10 and the supporting circuits for performing read and write operations on SRAM array 10. In some embodiments, SRAM array 10 includes a plurality of memory cells 30 arranged as an array. Memory cells 30 may be six-transistor (6T) SRAM cells, wherein an exemplary circuit diagram of a 6T SRAM cell is shown. Throughout the description, memory cells 30 are used as two/dual port cells (although there may have one physical port), on which the read and write operations may be performed in a same clock cycle of clock signal CLK (FIGS. 4 and 6). The expression of two/dual port indicates that memory cell 30 may be a dual-port SRAM cell or a two-port SRAM cell. Although the read and write operations that are performed in the same clock cycle are performed sequentially, the order may be transparent to the user of the SRAM cells. Accordingly, throughout the description, the read and write operations that are performed in the same clock cycle are referred to as simultaneous read and write operations.

The supporting circuits for performing read and write operations on SRAM array 10 include read/write clock generator 12, write address latches & pre-decoder 14, read address latches & pre-decoder 16, write column decoder 18, read column decoder 20, Sense Amplifier (SA)/write driver 22, and read/write row decoder 24. Read/write clock generator 12 is configured to receive a single clock signal CLK, and generate internal read and write clock signals CKP1 and CKP2 (FIGS. 4 and 6), which internal read/write clock signals CKP1 and CKP2 are used for the read and write operations of the memory cells in SRAM array 10. Throughout the description, the symbol "/" represents "and" or "or," and whether the symbol "/" represents an "and" or an "or" is related to the context in which the symbol "/" is used. For example, "SA/write driver" represents SA and write driver, and "read/write clock signals CKP1 and CKP2" means one of clock signals CKP1 and CKP2 is used as an internal write clock signal, and the other one of clock signals CKP1 and CKP2 is used as an internal read clock signal.

Write address latches & pre-decoder 14 is configured to receive and latch write address AA (a row address), and pre-decode write address AA. Read address latches & pre-decoder 16 is configured to receive and latch read address AB (a row address), and pre-decode read address AB. The pre-decoded addresses are provided to read/write row decoder 24, which selects one of word-lines WL. The selected word-line WL is the word-line of the SRAM cell 30 on which the read or write operation is to be performed. Read/write row decoder 24 uses word-line driver 26 to drive word-lines WL for both read and write operations. In some embodiments, word-line driver 26 comprises an OR gate, which performs the OR operation on the pre-decoded addresses received from write latches & pre-decoder 14 and read latches & pre-decoder 16. Word-line driver 26 outputs the resulting "OR"ed address to enable the selected word-line WL.

FIG. 1 also illustrates write column decoder 18 and read column decoder 20 for decoding the column of the selected SRAM cell 30 for performing the write operation and the read operation, respectively. SA 22 is configured to read from, and amplifier signals for, bit-lines (such as BL and BLB) of memory array 10. Write driver 22 is configured to drive input data to write to the bit-lines (such as BL and BLB) of memory array 10.

Figure 2:
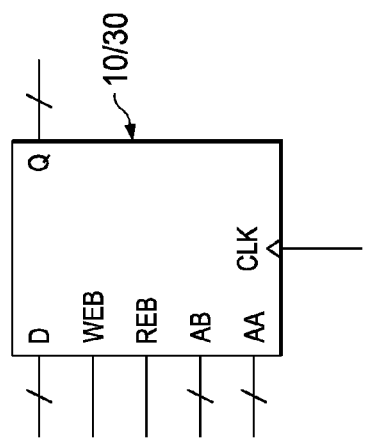
FIG. 2 illustrates a symbol diagram for the read and write operations of the SRAM cells in FIG. 1.

FIG. 2 illustrates a symbol diagram for the read and write operations of memory cell 30 in FIG. 1. As shown in FIG. 2, a single clock CLK is used to operate memory array 10 and SRAM cell 30. Symbol "D" represents the input data, and symbol "Q" represents the read-out data. Symbols WEB and REB are write-enable and read-enable signals, respectively, which control whether a write operation or a read operation is to be performed. Symbol AA is the write address, and Symbol AB is the read address.

Figure 3:
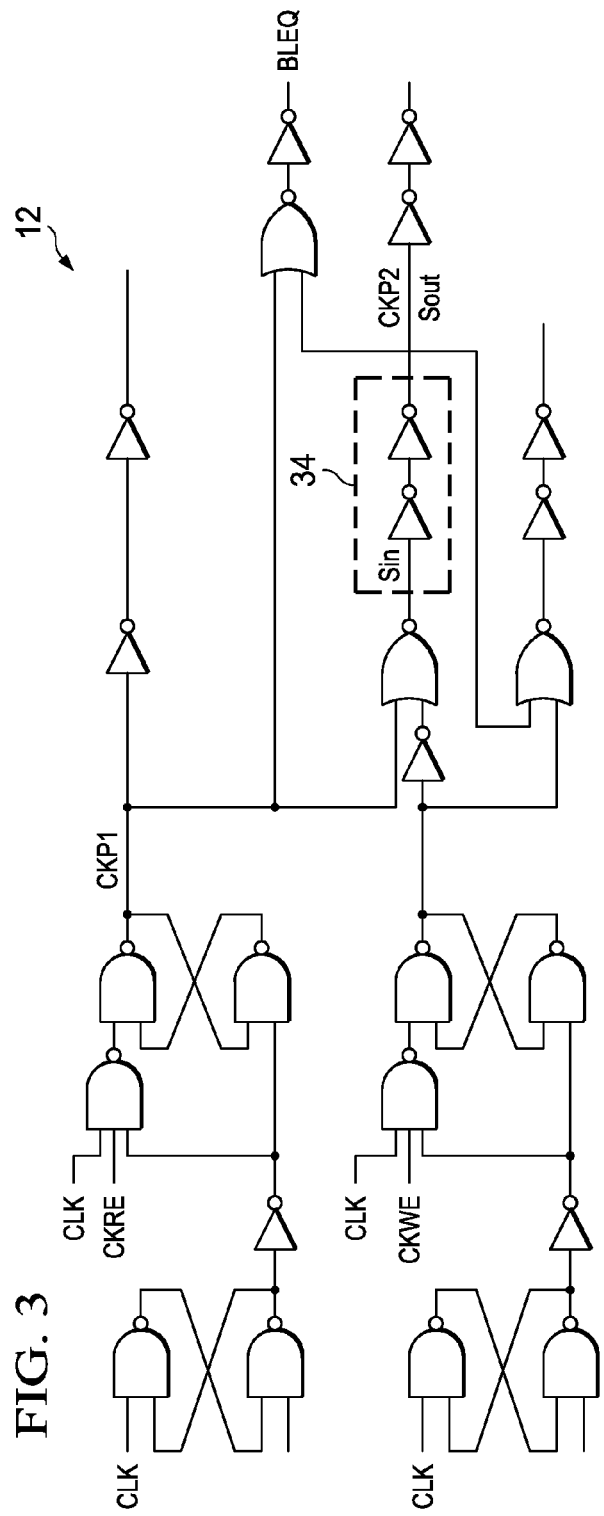
FIG. 3 illustrates an exemplary read/write clock generator in accordance with exemplary embodiments.

FIG. 3 illustrates an exemplary read/write clock generator 12, which receives clock signal CLK, and generates internal clock signal CKP1. The falling edge of internal clock signal CKP1 triggers the generation of the rising edge of internal clock signal CKP2. The edges (either the rising edges or the falling edges) of internal clock signals CKP1 and CKP2 are used to trigger read operations and write operations, respectively. Signals CKRE and CKWE are enable signals for the read and write operations, respectively, and may have inversed phases than WEB and REB signals, respectively, in FIG. 2. Also, in other embodiments, CKP1 may be triggered by CLK falling edge, and CKP2 may be triggered by CKP1 failing edge.

FIG. 4 illustrates an exemplary sequence diagram, wherein the clock signal CLK, REB, WEB, AA, and AB in FIG. 2 and clock signal CLK, internal clock signals CKP1 and CKP2 in FIG. 3, and the signal on word-line WL (FIG. 1) are illustrated. The signals in the sequence diagram may be generated using the circuit in FIG. 3. The symbols "cyc," "t," "r," "w," "ab," "aa," "s," and "h" represent cycle, time, read, write, AA address, AB address, setup time, and hold time, respectively. For example, symbol "trcyc" represents read clock cycle time, and symbol "tabs" represent the setup time for read address AB.

FIG. 4 illustrates three examples, including a read operation in clock cycle trcyc, a write operation in clock cycle twcyc, and simultaneous read and write operations in clock cycle trwcyc. In the illustrated examples in FIG. 4 (and also in FIG. 6), internal clocks CKP1 and CKP2 are the internal read clock and the internal write clock, respectively. In the first example, at time T1, read enable signal REB and read address AB are already ready, which enables the read operation. The rising edge of clock signal CLK at time T1 results in (triggers) the generation of the rising edge ER1 of internal clock signal CKP1, which in turn results in the generation of rising edge ER2 of word-line WL. The read operation on the selected SRAM cell 30 in FIG. 1 is thus performed.

In the second example, at time T2, write enable signal WEB and write address AA are already ready, which enables the write operation. The rising edge of clock signal CLK at time T2 results in the generation of the rising edge ER3 of internal clock signal CKP2, which in turn results in (triggers) the generation of rising edge ER4 of word-line WL. The write operation on the selected SRAM cell 30 in FIG. 1 is thus performed.

In the third example in which the simultaneously read and write operations are performed, at time T3, write enable signal WEB, write address AA, read enable signal REB, and read address AB are all ready, which enables both the read and write operations. The rising edge of clock CLK at time T3 triggers the generation of the rising edge ER5 of internal clock signal CKP1, which in turn triggers the generation of rising edge ER6 of word-line WL. The read operation on the selected SRAM cell 30 in FIG. 1 is thus performed. After the read operation is finished, the falling edge EF1 of internal clock signal CKP1 triggers the generation of rising edge ER7 of internal clock signal CKP2, which in turn triggers the generation of the rising edge ER8 of word-line WL. The write operation on the selected SRAM cell 30 in FIG. 1 is thus performed. Therefore, in the illustrated example, the write operation is performed immediately after the read operation, and both read and write operations are performed in the same clock cycle trwcyc. Accordingly, in this exemplary embodiment, a same rising edge (at time T3) of a single clock signal CLK drives the read and write operations in the same clock cycle trwcyc, which is considered as the simultaneous read and write operations. The respective SRAM cell 30 is hence operated similar to a two-/dual-port 6T SRAM cell. In the other words, CKP1 may be treated as write internal clock signal, and CKP2 be treated as a read internal clock signal.

Figure 5:
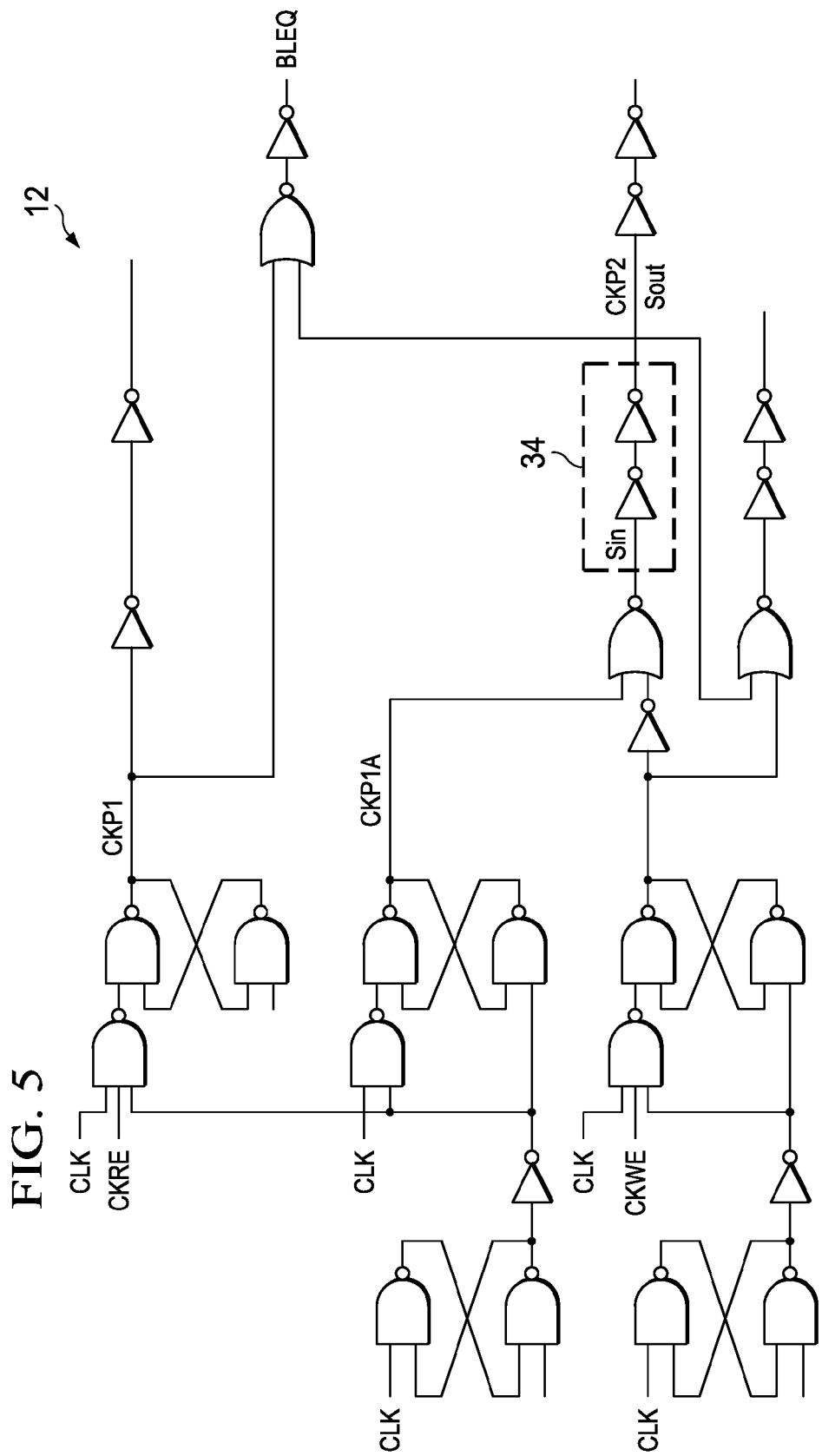
FIG. 5 illustrates an exemplary read/write clock generator in accordance with alternative embodiments.

FIG. 5 illustrates an exemplary read/write clock generator 12 in accordance with alternative embodiments. Read/write clock generator 12 in accordance with these embodiments receives clock signal CLK, and generates internal clock signal CKP1 and clock signal CKP1A. Internal clock signal CKP1 is used for the read operation. Internal clock signal CKP1A is not used for the read operation and write operation. The falling edge of internal clock signal CKP1A, however, triggers the generation of the rising edge of internal clock signal CKP2, which is used to trigger a write operation.

FIG. 6 illustrates an exemplary sequence diagram of the signals generated using the circuit in FIG. 5. Illustrated are three examples including a read operation in clock cycle trcyc, a write operation in clock cycle twcyc, and a simultaneous read and write operation in clock cycle trwcyc. The read operation in clock cycle trcyc and the simultaneous read and write operations in clock cycle trwcyc are essentially the same as in FIG. 4, and hence the detailed operations are not repeated herein. For the write operation in clock cycle twcyc, at time T2, write enable signal WEB and write address AA are already ready, which enables the write operation. The rising edge of clock signal CLK at time T2 results in the generation of the rising edge ER9 of internal clock signal CKP1A, which is used to delay the write operation. The falling edge EF2 of internal clock signal CKP1A triggers the generation of the rising edge ER10 of internal clock signal CKP2 (the internal write signal), which in turn triggers the generation of the rising edge ER11 of word-line WL. The write operation on the selected SRAM cell 30 (FIG. 1) is thus started. As occurring in clock cycle twcyc, the rising edge ER10 of internal clock signal CKP2 is delayed by time tdelay, which is the period of the high pulse of internal clock signal CKP1A. This is different from the embodiments shown in FIG. 4, in which rising edge ER3 for the write operation does not have such delay.

In the exemplary embodiments in FIGS. 4 and 6, and in clock cycle trwcyc, the read operations are illustrated as being performed before the respective write operations. In alternative embodiments, the read operations may be performed after the respective write operations. To make the write operations performed before the read operations, internal signal CKP1 is used for write operations, and internal clock signal CKP2 is used for read operations.

In clock cycle trwcyc (FIGS. 4 and 6), since the read and write operations are performed sequentially, an adequate bit-line pre-charging time needs to be reserved for pre-charging bit-lines BL and BLB (FIG. 1) to a desirable level (such as VDD). The bit-line pre-charging time is approximately time tpre, which is approximately from the middle point of falling edge EF1 to the middle point of rising edge ER7 (FIGS. 4 and 6). The needed bit-line pre-charging time needs to be long enough so that the bit-lines are adequately charged and short enough so that it does not result in the clock cycle time trwcyc to be unnecessarily extended, which unnecessary extension causes the speed of the SRAM operations to be reduced.

Figure 7:
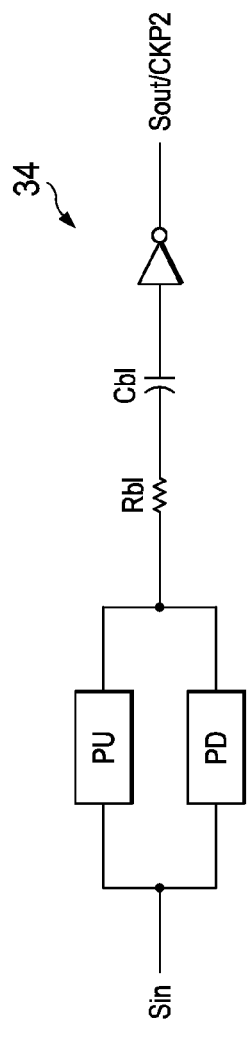
FIG. 7 illustrates the circuit diagram of an exemplary delay element used in FIGS. 3 and 5.

The control of the bit-line pre-charging time is achieved by inserting delay element 34 (FIGS. 3 and 5) into read/write clock generator 12, and between the generation of internal clock signal CKP1 and the generation of internal clock signal CKP2. FIG. 7 illustrates an exemplary implementation of delay element 34. Delay element 34 receives input signal Sin, and generates output signal Sout, which may be internal clock signal CKP2. In some exemplary embodiments, delay element 34 includes pull-up device PU, which may include one or a plurality of pull-up devices (PMOS devices, for example). Delay element 34 further includes resistor Rbl and capacitor Cbl. Device PU is designed to track the performance (for example, by matching the size) of the pull up device (not shown) in the bit-line pre-charge circuit. Capacitor Cbl is designed to have the capacitance tracking the capacitance of normal bit-lines BL and BLB (FIG. 1). This may be achieved by forming a dummy bit-line 41 (FIG. 1), which may have the same length as normal bit-lines BL and BLB (FIG. 1). The capacitance of dummy bit-line 41 is used as the capacitance of Cbl. Similarly, resistor Rbl is designed to have the resistance tracking the resistance of normal bit-lines BL and BLB (FIG. 1). This may also be achieved by forming dummy bit-line 41, which may have the same length and the same width as normal bit-lines BL and BLB, wherein dummy bit-line 41 is used as resistor Rbl. Since devices PU, Rbl, and Cbl all track the performance and the load of the actual bit-line pre-charge circuit, when the bit-line pre-charging takes long time due to, for example, long bit-lines BL and BLB, delay element 34 also has an increased delay, and vice versa. The resulting read/write clock generator 12 is thus has an optimized bit-line pre-charging time, and the frequencies of read and write operations may be increased.

Figure 8:
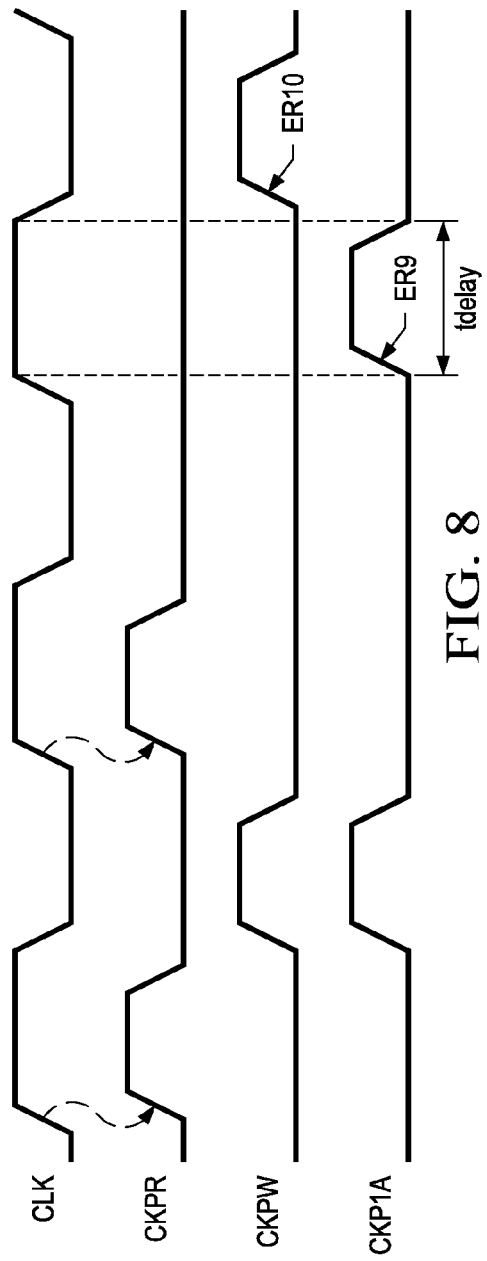
FIG. 8 illustrates portions of the sequence diagram that is shown in FIG. 6.

FIG. 8 illustrates portions of the sequence diagram shown in FIG. 6, wherein CKPR represents the one of internal clock signals CKP1 and CKP2 that is used for the read operations, and CKPW represents the one of internal clock signals CKP1 and CKP2 that is used for the write operations. As shown in FIG. 8, which is also shown in FIG. 4, rising edge ER10, which is for the write operation, is delayed by delay time tdelay, which is the high pulse width of CKP1A. Such delay time is utilized in the pre-decoding of write address AA and read address AB (FIGS. 1, 2, and 3) to reduce the sizes of write latches & pre-decoder 14 and read latches & pre-decoder 16.

Figure 9:
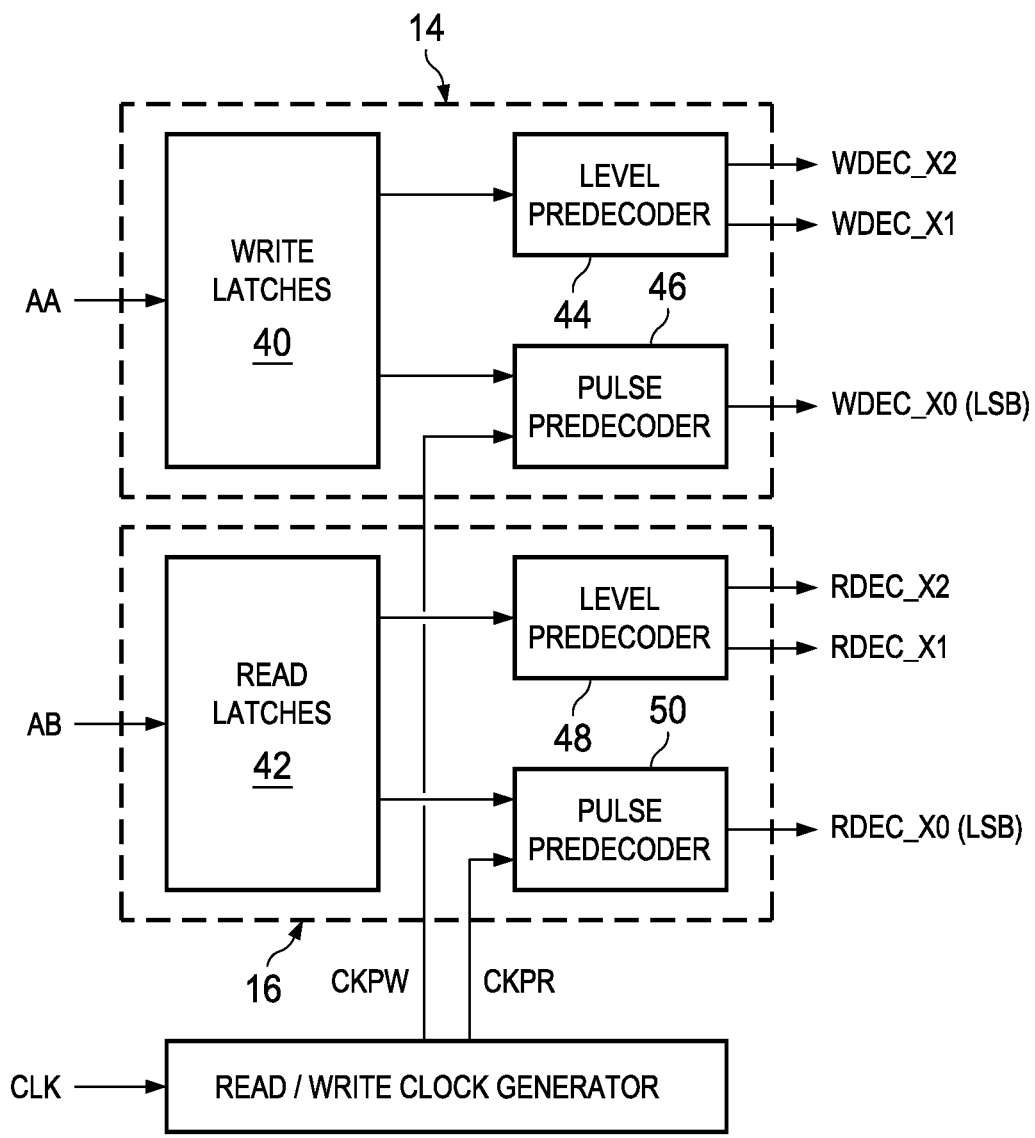
FIG. 9 illustrates the block diagram of exemplary latches & pre-decoders in accordance with embodiments, wherein each of the read latches & pre-decoder and write latches & pre-decoder includes a level pre-decoder and a pulse pre-decoder.

FIG. 9 illustrates the block diagram of exemplary write address latches & pre-decoder 14 and read address latches & pre-decoder 16 in accordance with embodiments. As shown in FIG. 9, write address AA and read address AB are latched by latches 40 and 42, respectively. Portions of the bits in write address AA, such as high bits, are pre-decoded as WDEC_X1 and WDEC_X2 using level pre-decoder 44. The remaining portions of the bits in write address AA, such as lower bits including Least Significant Bit (LSB) bit, are pre-decoded as WDEC_X0 using pulse pre-decoder 46. Similarly, read address AB is decoded by level pre-decoder 48 and pulse pre-decoder 50. Latches 40, level pre-decoder 44, and pulse pre-decoder 46 form write latches & pre-decoder 14 (also see FIG. 1). Latch 42, level pre-decoder 48, and pulse pre-decoder 50 form write latches & pre-decoder 16 in FIG. 1.

Level pre-decoders 44 and 48 may start decoding as soon as the preceding latches latch an address. On the other hand, pulse pre-decoders 46 and 50 start decoding addresses in response to the rising edges of internal read clock signal CKPW (also see FIG. 8) and internal write clock signal CKPR (also see FIG. 8), respectively. Generally, the level pre-decoders occupy smaller chip areas than pulse pre-decoders, but the decoding takes longer time than pulse pre-decoders. In the embodiments, by combining level pre-decoder 44/48 with pulse pre-decoder 46/50, the chip area occupied by the pre-decoders 14 and 16 may be reduced without sacrificing decoding time. The delay time tdelay (FIGS. 6 and 8) extends the time the can be used for level pre-decoding and further reducing chip area. For example, referring to FIG. 4, the time that can be used by level pre-decoder 44 (FIG. 8) is taas. In FIG. 6, however, the time that can be used by level pre-decoder 44 is increased to (taas+tdelay). Therefore, by adopting the design in FIGS. 5 and 6, more bits in addresses AA and AB can be assigned to level pre-decoders 44 and 48, so that the overall chip area usage of write latches & pre-decoder 14 and read latches & pre-decoder 16 is reduced.

In the embodiments, simultaneously read and write operations may be performed in a same clock cycle, and one clock CLK, rather than two, is used for the simultaneously read and write operations of 6T SRAM cells. Furthermore, although a single clock CLK is used, either the rising edges or the falling edges, but not both, of the clock signal CLK is used for triggering read and write operations. This reduces the difficult in tuning the performance of the reading and the writing of the 6T SRAM cells.

In accordance with embodiments, a method includes generating a first and a second internal clock signal from a clock signal, wherein a first internal clock signal edge of the first internal clock signal and a second internal clock signal edge of the second internal clock signal are generated from a same edge of the clock signal. A first one of the first and the second internal clock edges is used to trigger a first operation on a 6T SRAM cell of a SRAM array. A second one of the first and the second internal clock edges is used to trigger a second operation on the 6T SRAM cell, wherein the first and the second operations include a read operation and a write operation. The read operation and the write operation are performed within a same clock cycle of the clock signal.

In accordance with other embodiments, a method includes triggering generation of a first internal clock signal from a clock signal, wherein a first internal clock signal edge and a second internal clock edge of the first internal clock signal are generated from an edge of the clock signal. The second internal clock edge has a direction opposite to a direction of the first internal clock signal edge. The second internal clock edge is immediately after the first internal clock signal edge, with no other edges therebetween. The method further includes triggering generation of a second internal clock signal, wherein a third internal clock signal edge of the second internal clock signal is generated from the second internal clock edge of the first internal clock signal. A write operation is performed on a 6T SRAM cell of a SRAM array using the third internal clock signal edge.

In accordance with yet other embodiments, a device includes a read/write clock generator having an input, a first output, and a second output. The read/write clock generator is configured to generate from an edge of a clock signal received from the input, and output a first internal clock signal and a second internal clock signal to the first output and the second output, respectively. A read pre-decoder has a first input connected to the first output of the read/write clock generator. The read pre-decoder is configured to, upon the first internal clock signal, pre-decoding a row address of a 6T SRAM cell of an SRAM array. A write pre-decoder has a second input connected to the second output of the read/write clock generator. The write pre-decoder is configured to, upon the second internal clock signal, pre-decoding the row address of the 6T SRAM cell. A read/write row decoder is connected to an output of the read pre-decoder and an output of the write pre-decoder, wherein the read/write row decoder is configured to select a word-line of the SRAM array using addresses decoded by the read pre-decoder and the write pre-decoder.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
generating a first internal clock signal edge of a first internal clock signal based on an edge of a clock signal;
generating a second internal clock signal edge of a second internal clock signal based on a third internal clock signal edge of the first internal clock signal, with the third internal clock signal edge of the first internal clock signal being in a direction that is opposite to the first internal clock signal edge, and wherein the third internal clock signal edge is after the first internal clock signal edge, with no other edges of the first internal clock signal therebetween;
using a first one of the first and the second internal clock signal edges to trigger a first operation on a six-transistor (6T) Static Random Access Memory (SRAM) cell of a SRAM array; and
using a second one of the first and the second internal clock signal edges to trigger a second operation on the 6T SRAM cell, wherein the first and the second operations comprise a read operation and a write operation, and wherein the read operation and the write operation are performed within a same clock cycle of the clock signal.

2. The method of claim 1, wherein the edge of the clock signal, the first internal clock signal edge, and the second internal clock signal edge are rising edges.

3. The method of claim 1, wherein the edge of the clock signal is a falling edge.

4. The method of claim 1, wherein the first operation is performed before the second operation, and wherein the first operation is the read operation, and the second operation is the write operation.

5. The method of claim 1, wherein the first operation is performed before the second operation, and wherein the first operation is the write operation, and the second operation is the read operation.

6. The method of claim 1, wherein the first operation is performed before the second operation, and wherein the first operation is performed on a first port of the 6T SRAM cell, and the second operation is performed on a second port of the 6T SRAM cell, with the 6T SRAM cell being a two-port SRAM.

7. The method of claim 1, wherein the first operation is performed before the second operation, and wherein the first operation is performed on a first port of the 6T SRAM cell, and the second operation is performed on a second port of the 6T SRAM cell, with the 6T SRAM cell being a dual-port SRAM.

8. The method of claim 1 further comprising adding a delay to postpone generating the second internal clock signal edge through a pre-charging delay element, wherein the pre-charging delay element comprises a dummy bit-line matching sizes of a bit-line of the 6T SRAM cell and dummy pull up/down devices tracking performance of a bit-line pre-charging of SRAM array.

9. The method of claim 1 further comprising pre-decoding a row/column address of the 6T SRAM cell, wherein the step of pre-decoding comprises:
using a level pre-decoder to decode a first portion of the row/column address; and
using a pulse pre-decoder to decode a second portion of the row/column address, wherein decoding the second portion of the row/column address is controlled by one of the first internal clock signal and the second internal clock signal.

10. A method comprising:
triggering generation of a first internal clock signal from a clock signal, wherein a first internal clock signal edge and a second internal clock edge of the first internal clock signal are generated from an edge of the clock signal, and wherein the second internal clock edge has a direction opposite to a direction of the first internal clock signal edge, and wherein the second internal clock edge is immediately after the first internal clock signal edge, with no other edges therebetween;
triggering generation of a second internal clock signal, wherein a third internal clock signal edge of the second internal clock signal is generated from the second internal clock edge of the first internal clock signal; and
triggering a write operation on a six-transistor (6T) Static Random Access Memory (SRAM) cell of a SRAM array using the third internal clock signal edge.

11. The method of claim 10, wherein the edge of the clock signal and the first internal clock signal edge are rising edges, and wherein the second internal clock edge is a falling edge.

12. The method of claim 10 further comprising:
triggering a read operation using the first internal clock signal edge, wherein the read operation is performed before the write operation, and wherein the read operation and write operation are performed in a same clock cycle of the clock signal.

13. The method of claim 12 further comprising:
triggering an additional write operation using the first internal clock signal edge, wherein the additional write operation is performed before the read operation, and wherein the read operation and additional write operation are performed in a same clock cycle of the clock signal.

14. The method of claim 10 further comprising:
triggering generation of a third internal clock signal from the clock signal, wherein a fourth internal clock signal edge of the third internal clock signal is generated from an additional edge of the clock signal; and
triggering a read operation on the 6T SRAM cell using the fourth internal clock signal edge.

15. The method of claim 10 further comprising adding a delay to postpone generating the second internal clock signal through a pre-charging delay element, wherein the pre-charging delay element comprises a dummy bit-line, and wherein a length of the dummy bit-line is close to a bit-line of the 6T SRAM cell.

16. The method of claim 10 further comprising pre-decoding a row/column address of the 6T SRAM cell, wherein the step of pre-decoding comprises:
using a level pre-decoder to decode a first portion of the row/column address; and
using a pulse pre-decoder to decode a second portion of the row/column address, wherein decoding the second portion of the row/column address is controlled by the third internal clock signal edge.

17. A device comprising:
a read/write clock generator configured to generate a first internal clock signal and a second internal clock signal from an edge of a clock signal received from an input of the read/write clock generator, to output the first internal clock signal to a first output of the read/write clock generator, and to output the second internal clock signal to a second output of the read/write clock generator;
a read pre-decoder comprising a first level pre-decoder, a first pulse pre-decoder, and a first input connected to the first output of the read/write clock generator, wherein the first pulse pre-decoder is configured to, upon a first edge of the first internal clock signal, pre-decode a first portion of a first row/column address of a first six-transistor (6T) Static Random Access Memory (SRAM) cell of a SRAM array, and wherein the first level pre-decoder is configured to, before the first edge of the first internal clock signal, pre-decode a second portion of the first row/column address;
a write pre-decoder comprising a second level pre-decoder, a second pulse pre-decoder, and a second input connected to the second output of the read/write clock generator, wherein the second pulse pre-decoder is configured to, upon a second edge of the second internal clock signal, pre-decode a first portion of a second row/column address of a second 6T SRAM cell, and wherein the second level pre-decoder is configured to, before the second edge of the second internal clock signal, pre-decode a second portion of the second row/column address; and
a read/write row/column decoder connected to an output of the read pre-decoder and an output of the write pre-decoder, wherein the read/write row decoder is configured to select a word-line of the SRAM array and the read/write column decoder is configured to select an active column of SRAM array using addresses decoded by the read pre-decoder and the write pre-decoder.

18. The device of claim 17, wherein the read/write clock generator is configured to generate a first rising edge of the first internal clock signal and a second rising edge of the second internal clock signal in a same clock cycle of the clock signal, wherein the first rising edge is the first edge of the first internal clock signal used to control the pre-decoding the first row/column address, and wherein the second rising edge is the second edge of the second internal clock signal used to control the pre-decoding the second row/column address.

19. The device of claim 17, wherein the read/write clock generator comprises a delay element configured to delay the second internal clock signal, wherein the delay element comprises:
a dummy bit-line having a length close to a length of a bit-line of the 6T SRAM cell; and
dummy pull up/down devices tracking a performance of a bit-line pre-charging of the SRAM array.

20. The device of claim 17, wherein the read/write row decoder is configured to perform an "OR" operation on a first row address carried by the output of the read pre-decoder and a second row address carried by the output of the write pre-decoder.

21. The device of claim 20, wherein the read/write row decoder comprises an OR gate comprising a first input connected to the output of the read pre-decoder, and a second input connected to the write pre-decoder, and an output connected to the SRAM array.

22. The device of claim 17, wherein the read pre-decoder and the write pre-decoder are separate pre-decoders.

23. The device of claim 17, wherein the read/write clock generator comprises:
first logic circuitry comprising a first latch, a first logic gate, and a second latch, the clock signal received from the input of the read/write clock generator being an input of the first latch, an output of the first latch being electrically coupled to a first input of the first logic gate and a first input of the second latch, the clock signal received from the input of the read/write clock generator being a second input of the first logic gate, an output of the first logic gate being electrically coupled to a second input of the second latch; and
second logic circuitry comprising a third latch, a second logic gate, a fourth latch, and a third logic gate, the clock signal received from the input of the read/write clock generator being an input of the third latch, an output of the third latch being electrically coupled to a first input of the second logic gate and a first input of the fourth latch, the clock signal received from the input of the read/write clock generator being a second input of the second logic gate, an output of the second logic gate being electrically coupled to a second input of the fourth latch, an output of the second latch being electrically coupled to a first input of the third logic gate, an output of the fourth latch being electrically coupled to a second input of the third logic gate, an output of the third logic gate being electrically coupled to the second output of the read/write clock generator to output the second internal clock signal.

24. The device of claim 23, wherein the output of the second latch is electrically coupled to the first output of the read/write clock generator to output the first internal clock signal.

25. The device of claim 23, wherein the first logic circuitry further comprises a fourth logic gate and a fifth latch, the output of the first latch being electrically coupled to a first input of the fourth logic gate, the clock signal received from the input of the read/write clock generator being a second input of the fourth logic gate, an output of the fourth logic gate being electrically coupled to an input of the fifth latch, an output of the fifth latch being electrically coupled to the first output of the read/write clock generator to output the first internal clock signal.

* * * * *